(12) United States Patent
Offeman et al.

(10) Patent No.: US 11,093,966 B2
(45) Date of Patent: Aug. 17, 2021

(54) SYSTEMS, METHODS AND ARTICLES FOR AUDIENCE DELIVERY OPTIMIZATION

(71) Applicant: WIDEORBIT LLC, San Francisco, CA (US)

(72) Inventors: William E. Offeman, Redmond, WA (US); Trevan Grant Zosel, Bothell, WA (US); Francisco Lopezalvarez, Woodinville, WA (US)

(73) Assignee: WIDEORBIT LLC, San Francisco, CA (US)

(*) Notice: Subject to any disclaimer, the term of this patent is extended or adjusted under 35 U.S.C. 154(b) by 113 days.

(21) Appl. No.: 16/143,214

(22) Filed: Sep. 26, 2018

(65) Prior Publication Data

US 2020/0097998 A1 Mar. 26, 2020

(51) Int. Cl.
*G06Q 30/02* (2012.01)
*G06F 30/20* (2020.01)

(52) U.S. Cl.
CPC ......... *G06Q 30/0243* (2013.01); *G06F 30/20* (2020.01)

(58) Field of Classification Search
CPC ............................ G06Q 30/0243; G06F 30/20
See application file for complete search history.

(56) References Cited

U.S. PATENT DOCUMENTS

| 7,085,732 B2 | 8/2006 | Gould |
| 7,949,562 B2 | 5/2011 | Collins |
| 8,073,738 B2 | 12/2011 | Protheroe et al. |
| 8,099,328 B2 | 1/2012 | Protheroe et al. |
| 8,316,392 B2 | 11/2012 | Ahanger et al. |

(Continued)

FOREIGN PATENT DOCUMENTS

| JP | 2007-226816 A | 9/2007 |
| JP | 2014-146274 A | 8/2014 |

(Continued)

OTHER PUBLICATIONS

"Prediction and Optimal Scheduling of Advertisements in Linear Television" (Bhatt, Ghan et al., MPI 2015 Report) (Year: 2015).*

(Continued)

*Primary Examiner* — James M Detweiler
(74) *Attorney, Agent, or Firm* — Seed Intellectual Property Law Group LLP

(57) ABSTRACT

Systems, methods and articles for providing optimized scheduling of a log of spots to be delivered to consumers. The optimized scheduling allows content providers to autonomously satisfy contracts and increase revenue. An audience delivery optimizer system receives an initial log, generates an optimized log, and returns the optimized log so that content can be delivered to consumers according to the optimized log. The audience delivery optimizer system may use historical ratings data and may implement an algorithm to accurately project future delivery. The audience delivery optimizer system may evaluate and optimize a log that spans a particular period of time, such as a day, a week, a month, etc. The audience delivery optimizer system may evaluate over-performing contracts and under-performing contracts and may then optimize the placement of spots based on such evaluations. The audience delivery optimizer system may track liability or other metrics over determined periods (e.g., quarterly).

27 Claims, 5 Drawing Sheets

(56) References Cited

U.S. PATENT DOCUMENTS

| | | | |
|---|---|---|---|
| 8,996,712 B2 | 3/2015 | Green et al. | |
| 9,584,840 B2 | 2/2017 | Tanner et al. | |
| 2007/0113244 A1* | 5/2007 | Verschueren | H04N 21/2547 725/35 |
| 2008/0071594 A1 | 3/2008 | Morin | |
| 2008/0221982 A1 | 9/2008 | Harkins et al. | |
| 2008/0243601 A1 | 10/2008 | Patel et al. | |
| 2008/0306804 A1* | 12/2008 | Opdycke | G06Q 30/0201 705/14.43 |
| 2009/0106100 A1 | 4/2009 | Mashinsky | |
| 2009/0327030 A1* | 12/2009 | Collins | G06Q 30/0244 705/14.43 |
| 2011/0040634 A1 | 2/2011 | Landsberry et al. | |
| 2011/0218859 A1 | 9/2011 | Wang et al. | |
| 2011/0225026 A1 | 9/2011 | Ketchum | |
| 2012/0209742 A1 | 8/2012 | Steigelfest | |
| 2012/0253775 A1* | 10/2012 | Chan | G06F 30/398 703/14 |
| 2013/0144723 A1 | 6/2013 | Green et al. | |
| 2013/0282495 A1 | 10/2013 | Gilbane et al. | |
| 2014/0136337 A1 | 5/2014 | Ringdahl | |
| 2014/0222590 A1 | 8/2014 | Chatter et al. | |
| 2014/0324603 A1 | 10/2014 | Savkar et al. | |
| 2015/0066628 A1 | 3/2015 | Ghosh et al. | |
| 2015/0095166 A1 | 4/2015 | Sweeney | |
| 2015/0106190 A1 | 4/2015 | Wang et al. | |
| 2017/0064365 A1* | 3/2017 | Chaar | H04N 21/254 |
| 2017/0098251 A1 | 4/2017 | Box et al. | |
| 2017/0098252 A1 | 4/2017 | Box et al. | |
| 2017/0098253 A1 | 4/2017 | Box et al. | |
| 2017/0255971 A1 | 9/2017 | Box et al. | |
| 2020/0004743 A1* | 1/2020 | Huang | G06N 5/022 |

FOREIGN PATENT DOCUMENTS

| | | |
|---|---|---|
| KR | 10-2010-0108191 A | 10/2010 |
| KR | 10-2012-0034434 A | 4/2012 |
| WO | 2015/024003 A2 | 2/2015 |

OTHER PUBLICATIONS

Extended European Search Report, dated Dec. 14, 2018, for European Application No. 16852483.3-1208, 9 pages.
Extended European Search Report, dated Dec. 14, 2018, for European Application No. 16852486.6-1208, 11 pages.
Extended European Search Report, dated Dec. 14, 2018, for European Application No. 16852490.8-1208, 9 pages.
Ferreira et al., "Systems, Methods and Articles for Buy-Side Optimization of Content Placement in Linear Mediacasts," U.S. Appl. No. 16/156,869, filed Oct. 10, 2018, 63 pages.
IAB, "OpenRTB API Specification," Version 2.1, Oct. 2012, 80 pages.
Thoman et al., "Systems, Methods and Articles for Sell-Side Optimization of Content Placement in Linear Mediacasts," U.S. Appl. No. 16/232,734, filed Dec. 26, 2018, 46 pages.
International Search Report dated Jan. 8, 2020 for International Application No. PCT/US2019/52620, 3 pages.
International Search Report and Written Opinion dated Dec. 8, 2016, for International Application No. PCT/US2016/054169, 15 pages.
International Search Report and Written Opinion dated Jan. 11, 2017, for International Application No. PCT/US2016/054183, 15 pages.
International Search Report and Written Opinion dated Jan. 13, 2017, for International Application No. PCT/US2016/054176, 11 pages.
International Search Report and Written Opinion dated Jun. 7, 2017, for International Application No. PCT/US2017/020436, 13 pages.
Office Action, dated Aug. 28, 2018, for U.S. Appl. No. 15/279,069, Box et al., "Systems, Methods and Articles to Facilitate Selling of Advertising Inventory ," 28 pages.
Office Action, dated Aug. 28, 2018, for U.S. Appl. No. 15/279,073, Box et al., "Systems, Methods and Articles to Facilitate Interoperability Between Advertising Inventory Channels ," 25 pages.
Office Action, dated Aug. 28, 2018, for U.S. Appl. No. 15/279,077, Box et al., "Systems, Methods and Articles to Facilitate Buying and Selling of Advertising Inventory ," 27 pages.

* cited by examiner

SYSTEMS, METHODS AND ARTICLES FOR AUDIENCE DELIVERY OPTIMIZATION

BACKGROUND

Technical Field

The present disclosure relates the field of computer technology, and more particularly, to computer systems and methods that provide media content to consumers.

Description of the Related Art

Content providers such as radio stations and networks, television stations and networks, Webcasters, digital publishers, etc., provide programming including content which is the subject of programming. Content providers' delivery of content is often via broadcasts, unicasts, multicasts (collectively, "mediacasts"). Programming often includes advertisements or "spots" interspersed with the subject matter of the programming. The advertisements may occur in segments or slots sometimes referred to as "ad breaks."

Content providers typically sell advertising time to generate revenue to fund operations, as well as generate profits. The scheduling of advertisement spots is an important process of the media business that must be conducted periodically (e.g., daily, weekly). Contracts or "deals" between advertisers and the content providers (e.g., cable networks) require the content providers to deliver a target viewership, specifically, a number of impressions of a particular demographic during the course of an advertising campaign. In many cases, deals are guaranteed, meaning the number of spots and the target viewership must be achieved as promised by the content provider. Further, the advertiser may place constraints on scheduling the spots, which may include requirements that spots air at a specified time of day or a specified day of the week, requirements that spots air during specified programs, requirements that spots not air during specified programs, requirements that spots air during specified portions (e.g., beginning, end) of advertisement breaks, etc.

A content provider may allocate a certain amount of time every hour for airing spots based in part on regulations and in part on the goal of retaining audience engagement. The air time available for a content provider to air spots is referred to as the available inventory. Generally, for an advertisement campaign viewership should try not to exceed the number of impressions requested by the advertiser because impressions beyond the contract quantity do not generate additional revenue for the content provider. Conversely, viewership should not fail to meet the number of impressions requested because that creates a liability for the content provider that must be remedied through make goods or audience deficiency units (ADUs).

Recently, content providers have recognized that they are under-utilizing their guaranteed inventory by not optimally scheduling advertising content segments into available advertisement slots. Accordingly, the present inventors have identified a need for improved systems and methods to optimizing the scheduling of advertising content segments into available advertisement slots.

BRIEF SUMMARY

An audience delivery optimization system may be summarized as including at least one nontransitory processor-readable storage medium that stores at least one of instructions or data; at least one processor communicatively coupled to the at least one nontransitory processor-readable storage medium, in operation, the at least one processor: receives an initial advertisement log that includes a plurality of advertisement slots that are filled with a plurality of advertisement content segments, each of the advertisement content segments associated with an advertisement campaign; for each advertisement content segment, determines permissible slots for the advertisement content segment using initial pruning criteria; for each advertisement content segment, determines a lift score for each permissible swap of the advertisement content segment with another advertisement segment; and retains only the permissible swaps that have a determined lift score that is above a lift score threshold; for each of the plurality of retained permissible swaps, evaluates the permissible swap based on desirability criteria that is indicative of how the swap affects the performances of the respective advertisement campaigns associated with the advertisement content segments of the swap; and retains only the desirable permissible swaps that meet the desirability criteria; optimizes the retained desirable permissible swaps based at least in part on the amount of lift generated by the swaps using Monte Carlo simulation; and generates an optimized advertisement log based on the results from the Monte Carlo simulation.

The initial pruning criteria may include one or more of inventory code, break code, or length of the advertisement content segment. The initial pruning criteria may include a plurality of business conflicts. To determine a lift score for each permissible swap, the at least one processor may determine whether the swap provides a net gain in lift. The at least one processor may retain only the permissible swaps that provide a net gain in lift. The desirability criteria may include whether the retained permissible swap is beneficial to both advertisement campaigns affected by the swap. For each of the retained permissible swaps that may be beneficial to one advertisement campaign and detrimental to the other advertisement campaign, the desirability criteria may include consideration of the relative performance of the two advertisement campaigns. The at least one processor may evaluate a performance for each of the advertisement campaigns, and consideration of the relative performance of the two advertisement campaigns may include designating a retained permissible swap as desirable only if the advertisement campaign for which the swap is beneficial is performing: worse than the advertisement campaign for which the swap is detrimental; the same as the advertisement campaign for which the swap is detrimental; or better than the advertisement campaign for which the swap is detrimental by a performance amount that is less than a determined performance difference threshold. The performance of each of the advertisement campaigns may include an estimate of the performance of the advertisement campaign relative to an advertisement campaign goal.

The at least one processor may determine a performance level for each of the advertisement campaigns that is one of an integer number of performance levels, and the determined performance difference threshold is equal to two performance levels. The number of performance levels may include five performance levels that range from under-performing to over-performing. The Monte Carlo simulation may include a multi-threaded Monte Carlo simulation having a plurality of parallel threads.

The at least one processor may receive a plurality of intermediate advertisement logs from the plurality of parallel threads, each of the intermediate advertisement logs specifying a set of swaps determined by a respective one of the plurality of threads; determine an amount of lift provided in each of the intermediate advertisement logs; and select the intermediate advertisement log that provides the most overall lift as the optimized advertisement log. The at least one processor may update lift scores for swaps during the optimization, and retain only the swaps that have an updated lift score that is above the lift score threshold. The at least one processor may reevaluate desirability criteria for swaps during the optimization, and retain only the swaps that meet the desirability criteria after the reevaluation.

A method of operating a processor-based audience delivery optimization system to optimize delivery of advertisements to audiences may be summarized as including receiving an initial advertisement log that includes a plurality of advertisement slots that are filled with a plurality of advertisement content segments, each of the advertisement content segments associated with an advertisement campaign; for each advertisement content segment, determining permissible slots for the advertisement content segment using initial pruning criteria; for each advertisement content segment, determining a lift score for each permissible swap of the advertisement content segment with another advertisement segment; and retaining only the permissible swaps that have a determined lift score that is above a lift score threshold; for each of the plurality of retained permissible swaps, evaluating the permissible swap based on desirability criteria that is indicative of how the swap affects the performances of the respective advertisement campaigns associated with the advertisement content segments of the swap; and retaining only the desirable permissible swaps that meet the desirability criteria; optimizing the retained desirable permissible swaps based at least in part on the amount of lift generated by the swaps using Monte Carlo simulation; and generating an optimized advertisement log based on the results from the Monte Carlo simulation.

Determining permissible slots for the advertisement content segment may include determining permissible slots for the advertisement content segment using initial pruning criteria that may include one or more of inventory code, break code, or length of the advertisement content segment. Determining permissible slots for the advertisement content segment may include determining permissible slots for the advertisement content segment using initial pruning criteria that may include a plurality of business conflicts. Determining a lift score for each permissible swap may include determining whether the swap provides a net gain in lift.

Retaining only the permissible swaps that have a determined lift score that is above a lift score threshold may include retaining only the permissible swaps that provide a net gain in lift. Evaluating the permissible swap based on desirability criteria may include evaluating the permissible swap based on desirability criteria that may include whether the retained permissible swap is beneficial to both advertisement campaigns affected by the swap. For each of the retained permissible swaps that is beneficial to one advertisement campaign and detrimental to the other advertisement campaign, evaluating the permissible swap based on desirability criteria may include evaluating the permissible swap based on desirability criteria that may include consideration of the relative performance of the two advertisement campaigns.

The method may further include evaluating a performance for each of the advertisement campaigns, and consideration of the relative performance of the two advertisement campaigns comprises designating a retained permissible swap as desirable only if the advertisement campaign for which the swap is beneficial is performing: worse than the advertisement campaign for which the swap is detrimental; the same as the advertisement campaign for which the swap is detrimental; or better than the advertisement campaign for which the swap is detrimental by a performance amount that is less than a determined performance difference threshold. Evaluating a performance of each of the advertisement campaigns may include evaluating an estimate of the performance of the advertisement campaign relative to an advertisement campaign goal.

The method may further include determining a performance level for each of the advertisement campaigns that is one of an integer number of performance levels, and the determined performance difference threshold is equal to two performance levels. Determining a performance level may include determining a performance level for each of the advertisement campaigns that is one of an integer number of performance levels, and the number of performance levels comprises five performance levels that range from under-performing to over-performing. Optimizing the retained desirable permissible swaps may include optimizing the retained desirable permissible swaps based at least in part on the amount of lift generated by the swaps using Monte Carlo simulation, and the Monte Carlo simulation may include a multi-threaded Monte Carlo simulation having a plurality of parallel threads.

Optimizing the retained desirable permissible swaps may include receiving a plurality of intermediate advertisement logs from the plurality of parallel threads, each of the intermediate advertisement logs specifying a set of swaps determined by a respective one of the plurality of threads; determining an amount of lift provided in each of the intermediate advertisement logs; and selecting the intermediate advertisement log that provides the most overall lift as the optimized advertisement log. Optimizing of the retained desirable permissible swaps may include updating lift scores for swaps, and retaining only the swaps that have an updated lift score that is above the lift score threshold. Optimizing of the retained desirable permissible swaps may include reevaluating desirability criteria for swaps during the optimization, and retaining only the swaps that meet the desirability criteria after the reevaluation.

A nontransitory processor-readable storage medium that stores at least one of instructions or data that, when executed by at least one processor of an audience delivery optimizer system, may be summarized as causing the at least one processor to receive an initial advertisement log that includes a plurality of advertisement slots that are filled with a plurality of advertisement content segments, each of the advertisement content segments associated with an advertisement campaign; for each advertisement content segment, determine permissible slots for the advertisement content segment using initial pruning criteria; for each advertisement content segment, determine a lift score for each permissible swap of the advertisement content segment with another advertisement segment; and retain only the permissible swaps that have a determined lift score that is above a lift score threshold; for each of the plurality of retained permissible swaps, evaluate the permissible swap based on desirability criteria that is indicative of how the swap affects the performances of the respective advertisement campaigns associated with the advertisement content segments of the swap; and retain only the desirable permissible swaps that meet the desirability criteria; optimize the retained desirable permissible swaps based at least in part on the amount of lift generated by the swaps using Monte Carlo simulation; and generate an optimized advertisement log based on the results from the Monte Carlo simulation.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1:
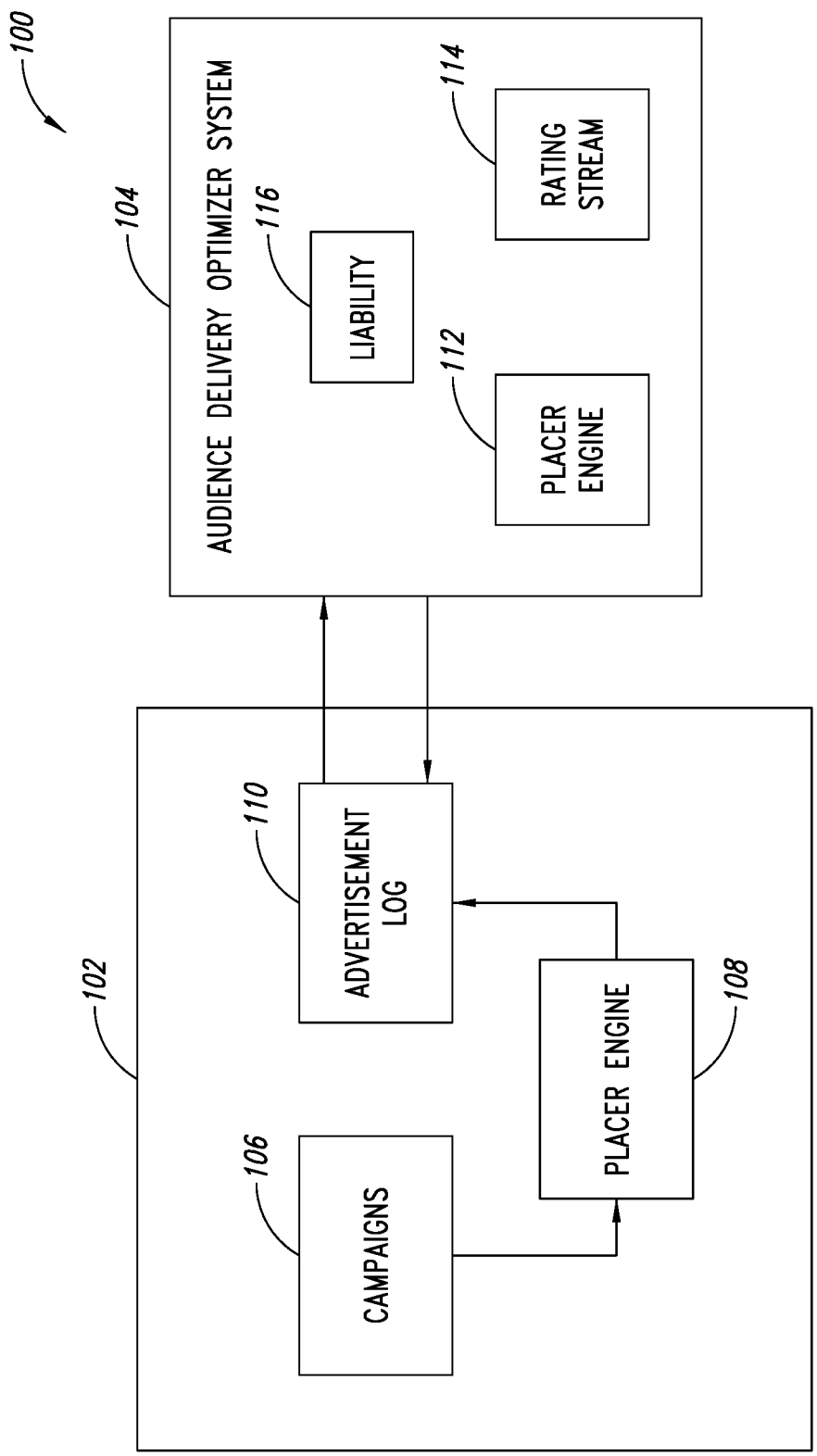
FIG. 1 is a schematic diagram of a networked environment, including an advertisement operations system and an audience delivery optimization system, according to one non-limiting illustrated implementation.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

One or more implementations of the present disclosure are directed to computer-implemented systems and methods of optimizing the scheduling of advertisements, or "spots," to allow content providers (e.g., cable networks) to satisfy contracts and to increase advertisement sales revenue. The scheduling of advertisement spots is an extremely difficult problem to optimize manually due to complex "buy-side" constraints imposed by advertisers as well as other factors, such as the vast number of possible combinations of scheduling spots into a number (e.g., 1000, 1500) of advertisement slots. As indicated above, under-performing deals require additional audience deficiency units (ADUs), and over-performing deals result in lost revenue. Due to the complexity of scheduling spots and the limited staffing available for content providers, it is often difficult or impractical to manage liability on a deal to deal basis. The systems and methods discussed herein advantageously provide optimized advertisement logs that significantly reduce the liability of content providers and increases revenue. In at least some implementations, the systems and methods discussed herein may increase revenue lift by 2 to 5 percent, or more.

FIG. 1 shows a networked environment 100 according to one illustrated implementation in which various apparatus, methods and articles described herein may operate. In this example, the environment 100 includes an advertisement operations system 102 and an audience delivery optimization system 104. The various components in the environment 100 may be communicatively coupled by one or more networks (e.g., Internet) or other communications channels. Further, the advertisement operations system 102 and the audience delivery optimization system 104 may in practice be implemented as a single system, as multiple systems, or any combination thereof. A non-limiting example of an advertisement operations system is WO Network offered by WideOrbit, Inc.

In this example, the advertisement operations system 102 includes a campaigns database 106, a placer engine 108, and an advertisement log database 110. The audience delivery optimizer system 104 includes a placer engine 112 and a ratings stream module 114 that receives historical ratings data, such as historical quarter-hours ratings data or ratings data defined by an advertiser's research team, for example. The audience delivery optimizer system 104 may also include a liability module 116 that stores liability data for the campaigns. As discussed further below, such liability data may include historical liability data, present liability data, future predicted liability data, and/or any combination thereof. The campaigns database 106 and/or the audience delivery optimizer system 100 may store data relating to individual campaigns or deals, such as deal constraints, separations, conflicts, guaranteed delivery, deal status (e.g., under-performing, over-performing), deal projected status, etc.

As further discussed below, in operation the audience delivery optimizer system 104 receives an initial advertisement log from the advertisement operations system 102, generates an optimized advertisement log, and returns the optimized advertisement log to the advertisement operations system so that content can be delivered to consumers according to the optimized advertisement log. The audience delivery optimizer system 104 uses historical ratings data and implements a sophisticated algorithm to accurately project future delivery. In at least some implementations, the audience delivery optimizer system 104 evaluates and optimizes an advertisement log that spans a particular period of time, such as a day, a week, a month, etc. The audience delivery optimizer system 104 may evaluate over-performing deals and under-performing deals and then optimizes the placement of spots based on such evaluations. In at least some implementations, the audience delivery optimizer system 104 utilizes a multi-threaded Monte Carlo simulation to optimize the advertisement log. The audience delivery optimizer system 104 may evaluate and balance unit level delivery across various guaranteed demographics while honoring all deal constraints, separation requirements, and conflicts. In at least some implementations, the audience delivery optimizer system 104 may honor locked slots, which enables users to guarantee placement of spots when required.

In at least some implementations, the audience delivery optimizer system 104 and/or the advertisement operations system 102 may track liability over determined periods (e.g., quarterly). Financial liability may be calculated after the actual ratings data is available. The audience delivery optimizer system 104 may then calculate deal management liability using pre-optimization air times and post-optimization air times to provide various metrics to the content provider, such as the number of additional impressions delivered, the percent of additional impressions delivered, the increase in revenue lift delivered, the percent increase of revenue lift delivered, or other performance metrics. Such tracking information allows the content provider to easily discern the value provided by the audience delivery optimizer system 104.

Figure 2A:
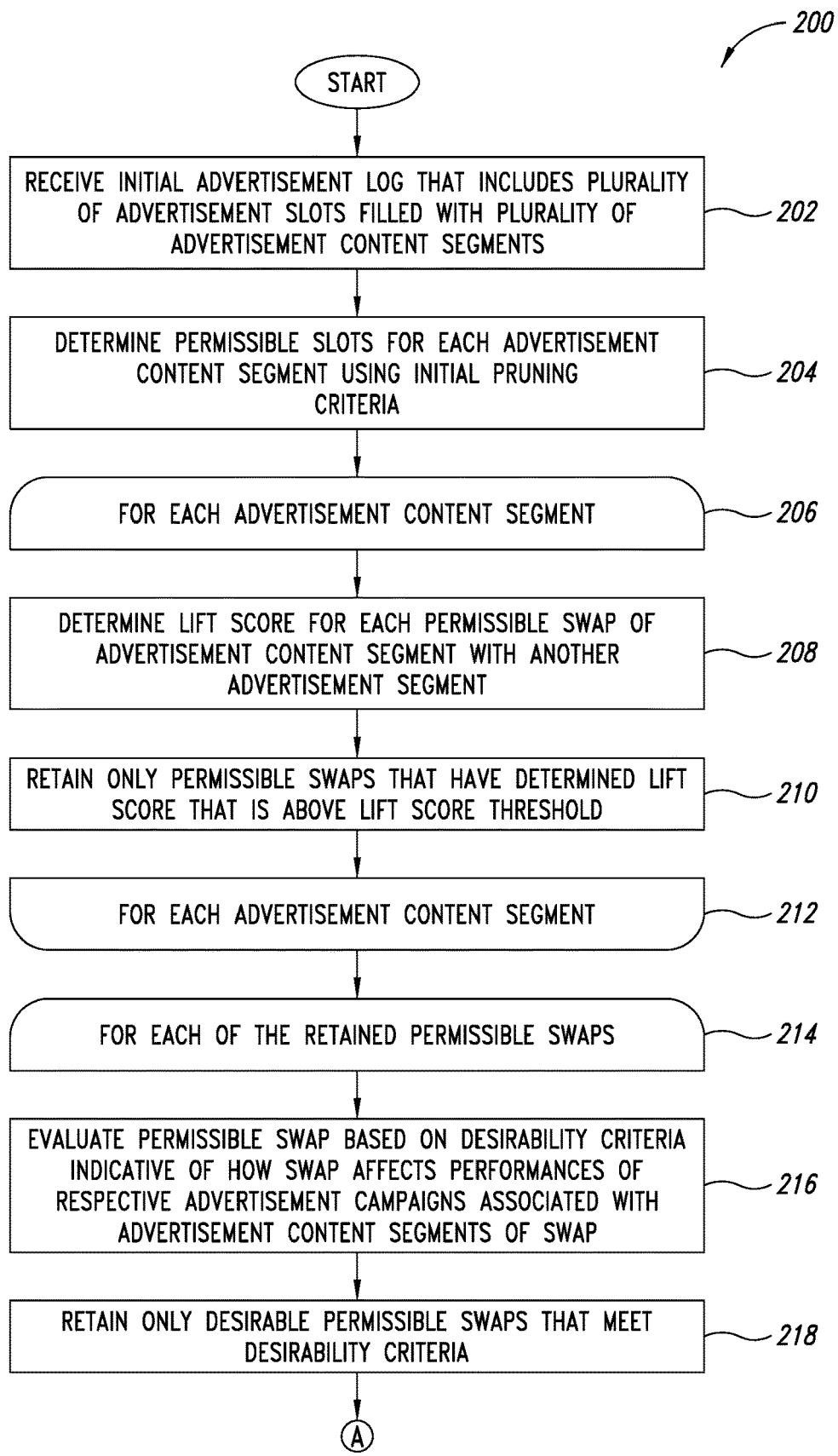
FIGS. 2A-2B are a flow diagram that depicts a method of operating an audience delivery optimization system to generate an optimized advertisement log that can be used to deliver advertisements to consumers, according to one non-limiting illustrated implementation.
Figure 2B:
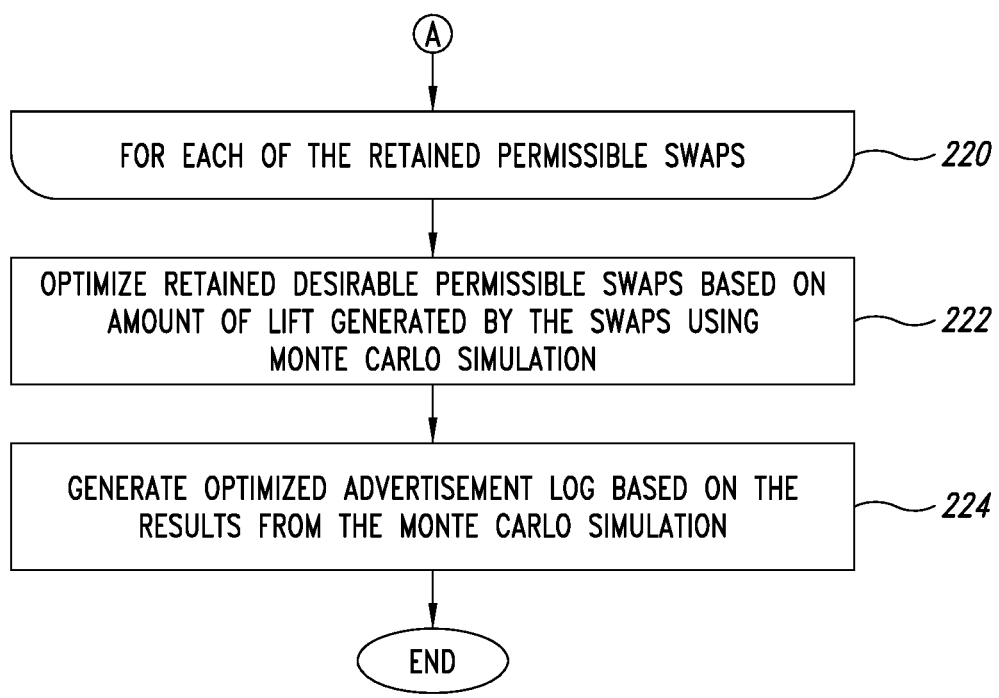

FIGS. 2A-2B depict a method 200 of operating an audience delivery optimization system, such as the audience delivery optimizer system 104 of FIG. 1, to optimize an advertisement log that can be used to deliver advertisement spots to consumers. The method 200 begins at 202, wherein the audience delivery optimizer system receives an initial advertisement log that includes a plurality of advertisement slots that are filled with a plurality of advertisement content segments or spots. Each of the advertisement content segments may be associated with an advertisement campaign. The initial advertisement log may be for a single day and may include spots placed in each of a plurality (e.g., 1000) of slots for the day. In at least some implementations, the advertisement log may cover a different period of time (e.g., week, month, quarter). As an example, the audience delivery optimizer system may receive the initial advertisement log from an advertisement operations system, such as the advertisement operations system 102 of FIG. 1.

At 204, for each advertisement content segment in the advertisement log, the audience delivery optimizer system may determine permissible slots in the log for the advertisement content segment using initial pruning criteria. As an example, the initial pruning criteria may include one or more of an inventory code, break code, or length of the advertisement content segment. The initial pruning criteria may additionally or alternatively include a plurality of business conflicts or requirements that indicate permissible slots for the advertisement content segment.

In a loop that begins at 206 and ends at 212, for each advertisement content segment, the audience delivery optimizer system may determine a lift score for each permissible swap of the advertisement content segment with another advertisement segment at 208. For example, the audience delivery optimization system may determine whether the swap between two advertisement content segments provides a net gain in lift to determine a lift score for each permissible swap.

At 210, the audience delivery optimizer system may retain only the permissible swaps that have a determined lift score that is above a lift score threshold. As an example, the audience delivery optimization system may retain only the permissible swaps that provide a net gain in lift.

In a loop that begins at 214 and ends at 220, for each of the plurality of retained permissible swaps, at 216 the audience delivery optimizer system may evaluate the permissible swap based on desirability criteria that is indicative of how the swap affects the performances of the respective advertisement campaigns associated with the advertisement content segments of the swap. For example, the desirability criteria may include whether the retained permissible swap is beneficial to both advertisement campaigns affected by the swap. In at least some implementations, for each of the retained permissible swaps that is beneficial to one advertisement campaign and detrimental to the other advertisement campaign, the desirability criteria may include consideration of the relative performance of the two advertisement campaigns.

Consideration of the relative performance of the two advertisement campaigns may include designating a retained permissible swap as desirable only if either the advertisement campaign for which the swap is beneficial is performing worse than the advertisement campaign for which the swap is detrimental, the same as the advertisement campaign for which the swap is detrimental, or better than the advertisement campaign for which the swap is detrimental by a performance amount that is less than a determined performance difference threshold. The performance of each of the advertisement campaigns comprises an estimate of the performance of the advertisement campaign relative to an advertisement campaign goal. In at least some implementations, the audience delivery optimizer system may determine a performance level for each of the advertisement campaigns that is one of an integer number of performance levels, and the determined performance difference threshold is equal to a number (e.g., one, two, three) of performance levels.

For example, the number of performance levels may include five performance levels that range from under-performing to over-performing (e.g., (1) significantly under-performing, (2) somewhat under-performing, (3) on target, (4) somewhat over-performing, (5) significantly over-performing). As an example, a swap involving a first campaign may be permissible if the swap is detrimental to a second campaign only if the second campaign is one level below the level of the first campaign, the same level as the first campaign, or at a higher level than the first campaign. For instance, a swap involving a first campaign that is at a level 4 (i.e., significantly over-performing) could be permissible if the swap is detrimental to a second campaign only if the second campaign is at a level 3, 4, or 5. As another example, a swap involving a first campaign that is at a level 3 (i.e., somewhat under-performing) could be permissible if the swap is detrimental to a second campaign only if the second campaign is at a level 2, 3, 4, or 5.

At 218, the audience delivery optimizer system may retain only the desirable permissible swaps that meet the desirability criteria.

At 222, the audience delivery optimizer system optimizes the retained desirable permissible swaps based at least in part on the amount of lift generated by the swaps using Monte Carlo simulation. In at least some implementations, the Monte Carlo simulation may include a multi-threaded Monte Carlo simulation having a plurality of parallel threads (e.g. four threads, eight threads, 16 threads, 32 threads).

At 224, the audience delivery optimizer system generates an optimized advertisement log based on the results from the Monte Carlo simulation. The optimized advertisement log may be provided to the advertisement operations system (e.g., system 102 of FIG. 1), so that the advertisements may be delivered according to the optimized advertisement log by the advertisement operations system.

In at least some implementations, the audience delivery optimizer system may update lift scores for swaps during the optimization, and may retain only the swaps that have an updated lift score that is above the lift score threshold (e.g., net gain in lift). Further, the audience delivery optimizer system may reevaluate desirability criteria for swaps during the optimization, and may retain only the swaps that meet the desirability criteria after the reevaluation.

Figure 3:
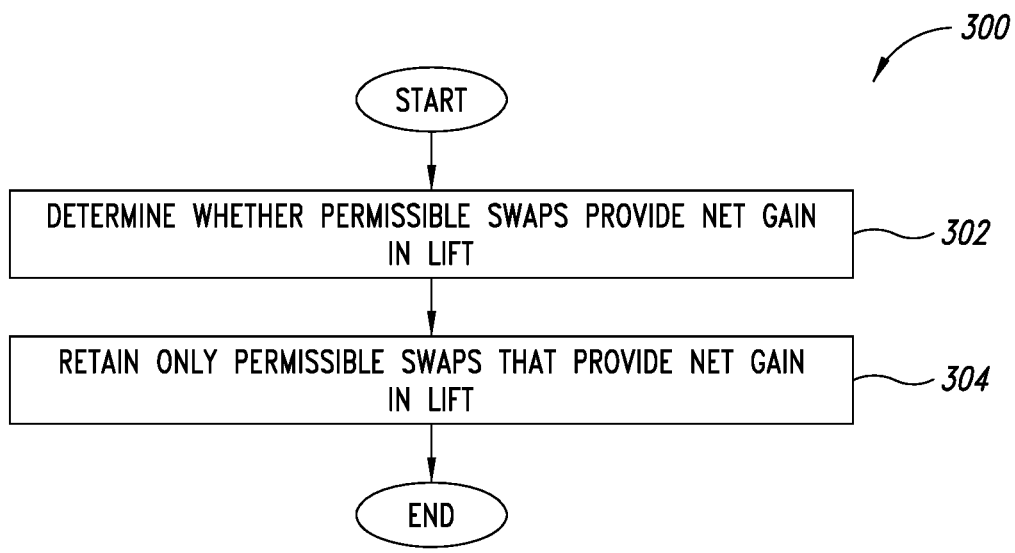
FIG. 3 is a flow diagram that depicts a method of operating an audience delivery optimization system to evaluate whether to retain permissible swaps when generating an optimized advertisement log, according to one non-limiting illustrated implementation.

FIG. 3 shows a method 300 of operating an audience delivery optimizer system to evaluate whether to retain permissible swaps when generating an optimized advertisement log. The method 300 begins at 302, wherein to determine a lift score for each permissible swap, the audience delivery optimizer system determines whether the swap provides a net gain in lift. For example, if a permissible swap provides a gain in lift for each of the two campaigns associated with the swap, then the swap will provide a net gain in lift. Conversely, if the permissible swap results in a reduction in lift for each of the two campaigns, then the swap will not provide a net gain in lift. If the permissible swap results in a gain in lift for a first campaign and a reduction in lift for second campaign, the swap will provide a net gain in lift only if the gain in lift for the first campaign is greater than the reduction in lift for the second campaign. As an example, if a permissible swap provides a gain in lift of $75 for the first campaign and a reduction in lift of $50 for the second campaign, the permissible swap provides a net gain in lift of $25. As noted above, in at least some implementations, the relative performance of the campaigns associated with a swap may be considered to determine whether to retain the swap.

At 304, the audience delivery optimizer system may retain only the permissible swaps that provide a net gain in lift. The reason for this is that permissible swaps that do not provide a net gain in lift do not provide a net benefit and would not serve to increase the revenue of the content provider.

Figure 4:
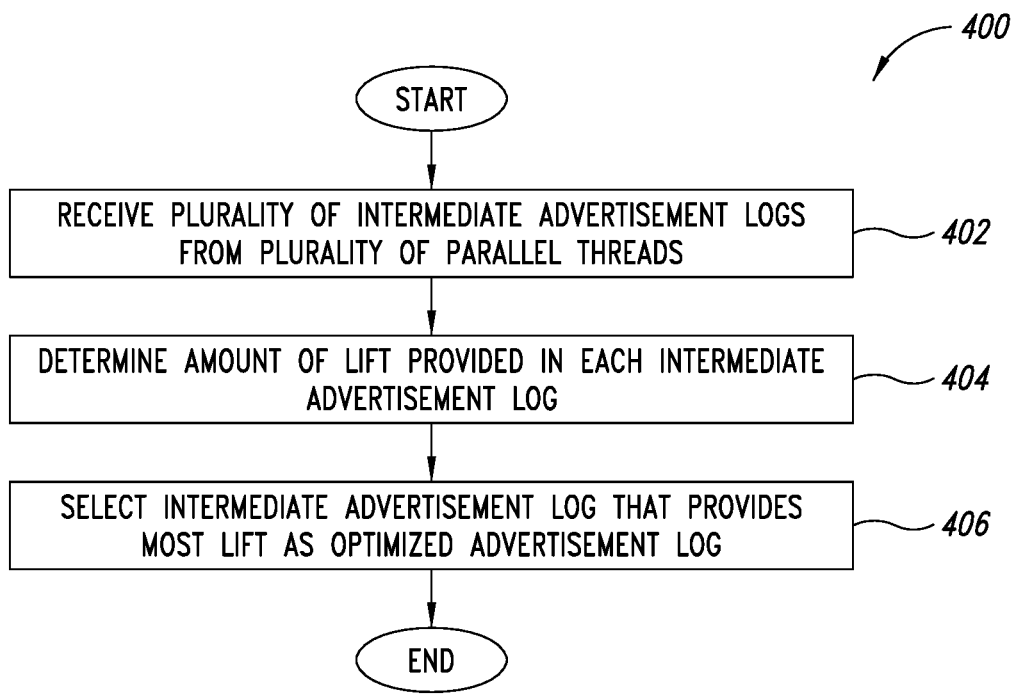
FIG. 4 is a flow diagram that depicts a method of operating an audience delivery optimization system to generate an optimized advertisement log using a multi-threaded process, according to one non-limiting illustrated implementation.

FIG. 4 shows a method 400 of operating an audience delivery optimizer system to generate an optimized advertisement log using a multi-threaded Monte Carlo simulation that has a plurality of parallel threads (e.g., 2 threads, 5 threads, 16 threads, 32 threads). The method begins at 402, wherein the audience delivery optimizer system receives a plurality of intermediate advertisement logs from the plurality of parallel threads. Each of the intermediate advertisement logs may specify a set of swaps determined by a respective one of the plurality of threads. At 404, the advertisement log optimization system may determine an amount of lift provided in each of the intermediate advertisement logs. At 406, the advertisement log optimization system may select the intermediate advertisement log that provides the most lift as the optimized advertisement log. As discussed above, the advertisement log optimization system may return the selected optimized advertisement log to the advertisement operations system so that advertisements may be delivered according to the optimized advertisement log.

Figure 5:
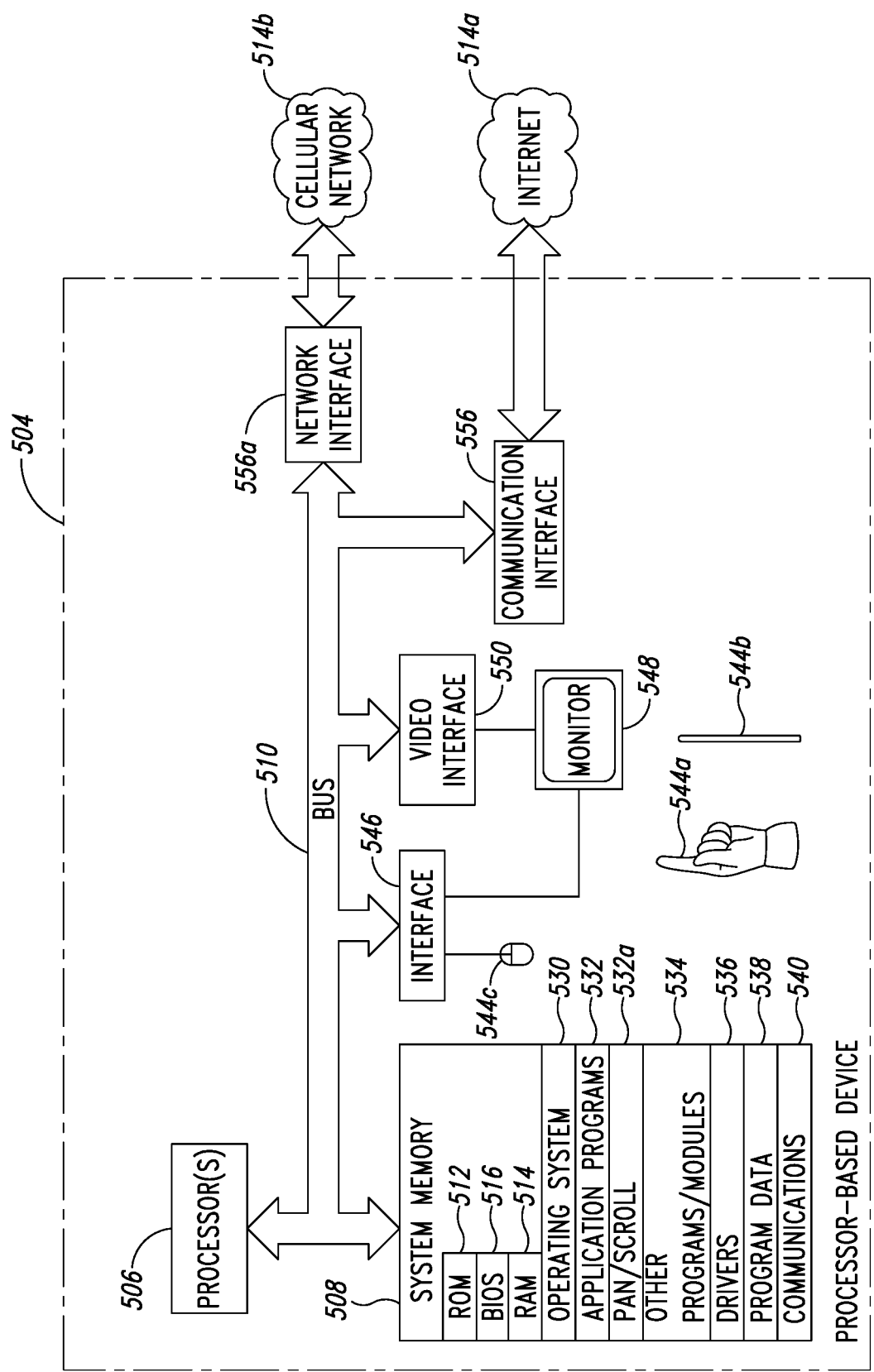
FIG. 5 is a schematic diagram of an example computing environment in which one or more systems and methods of the present disclosure may be implemented, according to one non-limiting illustrated implementation.

FIG. 5 shows a processor-based device 504 suitable for implementing the various functionality described herein. Although not required, some portion of the implementations will be described in the general context of processor-executable instructions or logic, such as program application modules, objects, or macros being executed by one or more processors. Those skilled in the relevant art will appreciate that the described implementations, as well as other implementations, can be practiced with various processor-based system configurations, including handheld devices, such as smartphones and tablet computers, wearable devices, multiprocessor systems, microprocessor-based or programmable consumer electronics, personal computers ("PCs"), network PCs, minicomputers, mainframe computers, and the like.

The processor-based device 504 may include one or more processors 506, a system memory 508 and a system bus 510 that couples various system components including the system memory 508 to the processor(s) 506. The processor-based device 504 will at times be referred to in the singular herein, but this is not intended to limit the implementations to a single system, since in certain implementations, there will be more than one system or other networked computing device involved. Non-limiting examples of commercially available systems include, but are not limited to, ARM processors from a variety of manufactures, Core microprocessors from Intel Corporation, U.S.A., PowerPC microprocessor from IBM, Sparc microprocessors from Sun Microsystems, Inc., PA-RISC series microprocessors from Hewlett-Packard Company, 68xxx series microprocessors from Motorola Corporation.

The processor(s) 506 may be any logic processing unit, such as one or more central processing units (CPUs), microprocessors, digital signal processors (DSPs), application-specific integrated circuits (ASICs), field programmable gate arrays (FPGAs), etc. Unless described otherwise, the construction and operation of the various blocks shown in FIG. 5 are of conventional design. As a result, such blocks need not be described in further detail herein, as they will be understood by those skilled in the relevant art.

The system bus 510 can employ any known bus structures or architectures, including a memory bus with memory controller, a peripheral bus, and a local bus. The system memory 508 includes read-only memory ("ROM") 512 and random access memory ("RAM") 514. A basic input/output system ("BIOS") 516, which can form part of the ROM 512, contains basic routines that help transfer information between elements within processor-based device 504, such as during start-up. Some implementations may employ separate buses for data, instructions and power.

The processor-based device 504 may also include one or more solid state memories, for instance Flash memory or solid state drive (SSD) 518, which provides nonvolatile storage of computer-readable instructions, data structures, program modules and other data for the processor-based device 504. Although not depicted, the processor-based device 504 can employ other nontransitory computer- or processor-readable media, for example a hard disk drive, an optical disk drive, or memory card media drive.

Program modules can be stored in the system memory 508, such as an operating system 530, one or more application programs 532, other programs or modules 534, drivers 536 and program data 538.

The application programs 532 may, for example, include panning/scrolling 532a. Such panning/scrolling logic may include, but is not limited to logic that determines when and/or where a pointer (e.g., finger, stylus, cursor) enters a user interface element that includes a region having a central portion and at least one margin. Such panning/scrolling logic may include, but is not limited to logic that determines a direction and a rate at which at least one element of the user interface element should appear to move, and causes updating of a display to cause the at least one element to appear to move in the determined direction at the determined rate. The panning/scrolling logic 532a may, for example, be stored as one or more executable instructions. The panning/scrolling logic 532a may include processor and/or machine executable logic or instructions to generate user interface objects using data that characterizes movement of a pointer, for example data from a touch-sensitive display or from a computer mouse or trackball, or other user interface device.

The system memory 508 may also include communications programs 540, for example a server and/or a Web client or browser for permitting the processor-based device 504 to access and exchange data with other systems such as user computing systems, Web sites on the Internet, corporate intranets, or other networks as described below. The communications programs 540 in the depicted implementation is markup language based, such as Hypertext Markup Language (HTML), Extensible Markup Language (XML) or Wireless Markup Language (WML), and operates with markup languages that use syntactically delimited characters added to the data of a document to represent the structure of the document. A number of servers and/or Web clients or browsers are commercially available such as those from Mozilla Corporation of California and Microsoft of Washington.

While shown in FIG. 5 as being stored in the system memory 508, the operating system 530, application programs 532, other programs/modules 534, drivers 536, program data 538 and server and/or browser 540 can be stored on any other of a large variety of nontransitory processor-readable media (e.g., hard disk drive, optical disk drive, SSD and/or flash memory).

A user can enter commands and information via a pointer, for example through input devices such as a touch screen 548 via a finger 544a, stylus 544b, or via a computer mouse or trackball 544c which controls a cursor. Other input devices can include a microphone, joystick, game pad, tablet, scanner, biometric scanning device, etc. These and other input devices (i.e., "I/O devices") are connected to the processor(s) 506 through an interface 546 such as touch-screen controller and/or a universal serial bus ("USB") interface that couples user input to the system bus 510, although other interfaces such as a parallel port, a game port or a wireless interface or a serial port may be used. The touch screen 548 can be coupled to the system bus 510 via a video interface 550, such as a video adapter to receive image data or image information for display via the touch screen 548. Although not shown, the processor-based device 504 can include other output devices, such as speakers, vibrator, haptic actuator, etc.

The processor-based device 504 may operate in a networked environment using one or more of the logical connections to communicate with one or more remote computers, servers and/or devices via one or more communications channels, for example, one or more networks 514a, 514b. These logical connections may facilitate any known method of permitting computers to communicate, such as through one or more LANs and/or WANs, such as the Internet, and/or cellular communications networks. Such networking environments are well known in wired and wireless enterprise-wide computer networks, intranets, extranets, the Internet, and other types of communication networks including telecommunications networks, cellular networks, paging networks, and other mobile networks.

When used in a networking environment, the processor-based device 504 may include one or more wired or wireless communications interfaces 514a, 514b (e.g., cellular radios, WI-FI radios, Bluetooth radios) for establishing communications over the network, for instance the Internet 514a or cellular network.

In a networked environment, program modules, application programs, or data, or portions thereof, can be stored in a server computing system (not shown). Those skilled in the relevant art will recognize that the network connections shown in FIG. 5 are only some examples of ways of establishing communications between computers, and other connections may be used, including wirelessly.

For convenience, the processor(s) 506, system memory 508, network and communications interfaces 514a, 514b are illustrated as communicably coupled to each other via the system bus 510, thereby providing connectivity between the above-described components. In alternative implementations of the processor-based device 504, the above-described components may be communicably coupled in a different manner than illustrated in FIG. 5. For example, one or more of the above-described components may be directly coupled to other components, or may be coupled to each other, via intermediary components (not shown). In some implementations, system bus 510 is omitted and the components are coupled directly to each other using suitable connections.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. An audience delivery optimization system, comprising:
at least one nontransitory processor-readable storage medium that stores at least one of instructions or data;
at least one processor communicatively coupled to the at least one nontransitory processor-readable storage medium, in operation, the at least one processor:
receives an initial advertisement log that includes a plurality of advertisement slots that are filled with a plurality of advertisement content segments, each of the advertisement content segments associated with a respective advertisement campaign;
for each advertisement content segment, determines permissible slots for the advertisement content segment using initial pruning criteria;
determines a plurality of permissible swaps between advertisement content segments based on the initial pruning criteria;
for each respective permissible swap of the plurality of permissible swaps, determines whether a net gain in lift is provided by swapping the advertisement content segments associated with the respective permissible swap;
retains only a subset of the plurality of permissible swaps that have a determined net gain in lift;
for each retained permissible swap of the retained subset of permissible swaps:
evaluates the retained permissible swap based on desirability criteria that is indicative of how the retained permissible swap affects performances of the respective advertisement campaigns associated with the advertisement content segments of the retained permissible swap; and
retains only desirable permissible swaps from the subset of permissible swaps that meet the desirability criteria;
optimizes the retained desirable permissible swaps based at least in part on the net gain in lift generated by the retained desirable permissible swaps using Monte Carlo simulation; and
generates an optimized advertisement log based on results from the Monte Carlo simulation.

2. The audience delivery optimization system of claim 1 wherein the initial pruning criteria comprises one or more of inventory code, break code, or length of the advertisement content segment.

3. The audience delivery optimization system of claim 1 wherein the initial pruning criteria comprises a plurality of business conflicts.

4. The audience delivery optimization system of claim 1 wherein the desirability criteria comprises whether the retained permissible swap is beneficial to both advertisement campaigns affected by the retained permissible swap.

5. The audience delivery optimization system of claim 1 wherein, for each of the retained permissible swaps that is beneficial to a first advertisement campaign and detrimental to a second advertisement campaign, the desirability criteria comprises consideration of a relative performance of the first and second advertisement campaigns.

6. The audience delivery optimization system of claim 5 wherein the at least one processor evaluates the relative performance for the first and second advertisement campaigns, and consideration of the relative performance of the first and second advertisement campaigns comprises designating a retained permissible swap as desirable only if the advertisement campaign for which the permissible swap is beneficial is performing:
worse than the advertisement campaign for which the permissible swap is detrimental;
the same as the advertisement campaign for which the permissible swap is detrimental; or
better than the advertisement campaign for which the permissible swap is detrimental by a performance amount that is less than a determined performance difference threshold.

7. The audience delivery optimization system of claim 6 wherein the relative performance of each of the first and second advertisement campaigns comprises an estimate of the relative performance of the first and second advertisement campaigns relative to an advertisement campaign goal.

8. The audience delivery optimization system of claim 6 wherein the at least one processor determines a performance level for each of the first and second advertisement campaigns that is one of an integer number of performance levels, and the determined performance difference threshold is equal to two performance levels.

9. The audience delivery optimization system of claim 8 wherein the number of performance levels comprises five performance levels that range from under-performing to over-performing.

10. The audience delivery optimization system of claim 1 wherein the Monte Carlo simulation comprises a multi-threaded Monte Carlo simulation having a plurality of parallel threads.

11. The audience delivery optimization system of claim 10 wherein the at least one processor:
receives a plurality of intermediate advertisement logs from the plurality of parallel threads, each of the intermediate advertisement logs specifying a set of swaps determined by a respective one of the plurality of threads;
determines an amount of lift provided in each of the intermediate advertisement logs; and
selects the intermediate advertisement log that provides the most overall lift as the optimized advertisement log.

12. The audience delivery optimization system of claim 1 wherein the at least one processor updates the determination of whether a net gain in lift provided by swaps during the optimization, and retains only the permissible swaps that have an updated net gain in lift.

13. The audience delivery optimization system of claim 1 wherein the at least one processor reevaluates the desirability criteria for swaps during the optimization, and retains only the swaps that meet the desirability criteria after the reevaluation.

14. A method of operating a processor-based audience delivery optimization system to optimize delivery of advertisements to audiences, the method comprising:
receiving an initial advertisement log that includes a plurality of advertisement slots that are filled with a plurality of advertisement content segments, each of the advertisement content segments associated with a respective advertisement campaign;

for each advertisement content segment, determining permissible slots for the advertisement content segment using initial pruning criteria;

determining a plurality of permissible swaps between advertisement content segments based on the initial pruning criteria;

for each respective permissible swap of the plurality of permissible swaps, determining whether a net gain in lift is provided by swapping the advertisement content segments associated with the respective permissible swap; and retaining only a subset of the plurality of permissible swaps that have a determined net gain in lift;

for each retained permissible swap of the retained subset of permissible swaps, evaluating the retained permissible swap based on desirability criteria that is indicative of how the retained permissible swap affects performances of the respective advertisement campaigns associated with the advertisement content segments of the retained permissible swap; and retaining only desirable permissible swaps from the subset of permissible swaps that meet the desirability criteria;

optimizing the retained desirable permissible swaps based at least in part on the net gain in lift generated by the retained desirable permissible swaps using Monte Carlo simulation; and generating an optimized advertisement log based on results from the Monte Carlo simulation.

15. The method of claim 14 wherein determining permissible slots for the advertisement content segment comprises determining permissible slots for the advertisement content segment using initial pruning criteria that comprises one or more of inventory code, break code, or length of the advertisement content segment.

16. The method of claim 14 wherein determining permissible slots for the advertisement content segment comprises determining permissible slots for the advertisement content segment using initial pruning criteria that comprises a plurality of business conflicts.

17. The method of claim 14 wherein evaluating the permissible swap based on desirability criteria comprises evaluating the permissible swap based on desirability criteria that comprises whether the retained permissible swap is beneficial to both advertisement campaigns affected by the retained permissible swap.

18. The method of claim 14 wherein, for each of the retained permissible swaps that is beneficial to a first advertisement campaign and detrimental to a second advertisement campaign, evaluating the permissible swap based on desirability criteria comprises evaluating the permissible swap based on desirability criteria that comprises consideration of a relative performance of the first and second advertisement campaigns.

19. The method of claim 18, further comprising:

evaluating the relative performance for the first and second advertisement campaigns, and consideration of the relative performance of the first and second advertisement campaigns comprises designating a retained permissible swap as desirable only if the advertisement campaign for which the permissible swap is beneficial is performing: worse than the advertisement campaign for which the permissible swap is detrimental; the same as the advertisement campaign for which the permissible swap is detrimental; or better than the advertisement campaign for which the permissible swap is detrimental by a performance amount that is less than a determined performance difference threshold.

20. The method of claim 19 wherein evaluating the relative performance of the first and second advertisement campaigns comprises evaluating an estimate of the relative performance of the first and second advertisement campaigns relative to an advertisement campaign goal.

21. The method of claim 19, further comprising:

determining a performance level for each of the advertisement campaigns that is one of an integer number of performance levels, and the determined performance difference threshold is equal to two performance levels.

22. The method of claim 21 wherein determining a performance level comprises determining a performance level for each of the advertisement campaigns that is one of an integer number of performance levels, and the number of performance levels comprises five performance levels that range from under-performing to over-performing.

23. The method of claim 14 wherein optimizing the retained desirable permissible swaps comprises optimizing the retained desirable permissible swaps based at least in part on the amount of lift generated by the swaps using Monte Carlo simulation, and the Monte Carlo simulation comprises a multi-threaded Monte Carlo simulation having a plurality of parallel threads.

24. The method of claim 23 wherein optimizing the retained desirable permissible swaps comprises:

receiving a plurality of intermediate advertisement logs from the plurality of parallel threads, each of the intermediate advertisement logs specifying a set of swaps determined by a respective one of the plurality of threads;

determining an amount of lift provided in each of the intermediate advertisement logs; and selecting the intermediate advertisement log that provides the most overall lift as the optimized advertisement log.

25. The method of claim 14 wherein optimizing of the retained desirable permissible swaps comprises updating the determination of whether a net gain in lift provided by swaps, and retaining only the permissible swaps that have an updated net gain in lift.

26. The method of claim 14 wherein optimizing of the retained desirable permissible swaps comprises reevaluating the desirability criteria for swaps during the optimization, and retaining only the swaps that meet the desirability criteria after the reevaluation.

27. A nontransitory processor-readable storage medium that stores at least one of instructions or data that, when executed by at least one processor of an audience delivery optimizer system, cause the at least one processor to:

receive an initial advertisement log that includes a plurality of advertisement slots that are filled with a plurality of advertisement content segments, each of the advertisement content segments associated with a respective advertisement campaign;

for each advertisement content segment, determine permissible slots for the advertisement content segment using initial pruning criteria;

determine a plurality of permissible swaps between advertisement content segments based on the initial pruning criteria;

for each respective permissible swap of the plurality of permissible swaps, determine whether a net gain in lift is provided by swapping the advertisement content segments associated with the respective permissible swap; and retain only a subset of the plurality of permissible swaps that have a determined net gain in lift;

for each retained permissible swap of the retained subset of permissible swaps, evaluate the retained permissible swap based on desirability criteria that is indicative of how the retained permissible swap affects performances of the respective advertisement campaigns associated with the advertisement content segments of the retained permissible swap; and retain only desirable permissible swaps from the subset of permissible swaps that meet the desirability criteria;

optimize the retained desirable permissible swaps based at least in part on the net gain in lift generated by the retained desirable permissible swaps using Monte Carlo simulation; and generate an optimized advertisement log based on results from the Monte Carlo simulation.

\* \* \* \* \*